United States Patent [19]
Yeap et al.

[11] Patent Number: 6,144,063
[45] Date of Patent: *Nov. 7, 2000

[54] ULTRA-THIN OXIDE FOR SEMICONDUCTORS

[75] Inventors: Geoffrey Choh-Fei Yeap, Sunnyvale; Zoran Krivokapic, Santa Clara; Ming-Ren Lin, Cupertino, all of Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/047,951

[22] Filed: Mar. 25, 1998

[51] Int. Cl.⁷ ...................................................... H01L 29/72
[52] U.S. Cl. ......................... 257/321; 257/296; 257/532; 438/151; 438/239; 438/585
[58] Field of Search ...................................... 257/321, 296, 257/532; 438/151, 239, 585

[56] References Cited

U.S. PATENT DOCUMENTS 6,054,735   4/2000   Ngo ........................................ 257/321

Primary Examiner—Edward Wojciechowicz
Attorney, Agent, or Firm—Mikio Ishimaru

[57] ABSTRACT

A semiconductor device having a transistor or capacitor with an ultra-thin oxide, which is thinner than 10 angstrom in thickness, is manufactured by eliminating a gate oxidation step in the processing and using the polysilicon reoxidation step to create the ultra-thin gate oxide by diffusion after formation of the gate.

20 Claims, 2 Drawing Sheets

ULTRA-THIN OXIDE FOR SEMICONDUCTORS

TECHNICAL FIELD

The present invention relates generally to semiconductors and more specifically to thin oxides for sub-100 nanometer semiconductors.

BACKGROUND ART

In the past, as semiconductor devices were scaled down in size, thinner and thinner oxides were required for proper operation of the smaller and smaller transistors. The reductions in oxide thickness were achieved by reduction in oxidation time, decreases in oxidation temperature, and decreases in oxygen flow or concentration during processing of the semiconductor wafer.

This approach has been successful as the semiconductor devices were scaled down from micron to submicron levels. As the semiconductor devices are scaled down to the sub-100 nanometer range, even thinner oxides are required and it is apparent that there are limits to how much the oxidation time can be reduced, the oxidation temperature decreased, and the oxygen flow decreased.

At one minute of oxidation time, a maximum oxidation temperature of 800° C., and low oxygen flow, which are the practical limits of the various parameters, the theoretical limit of the thinnest oxide is still greater than 10 angstrom. Further reductions in time, increases in temperature, or reductions in oxygen flow eliminate manufacturing reproducibility and make the oxide thickness undependable.

Thus, there appear to be practical limits on the ability to scale down semiconductor devices using the conventional approach.

For sub-100 nanometer semiconductor devices, it is absolutely necessary that the transistor gate oxide thickness be below 10 angstroms in thickness. And there is apparently no way of reaching this thickness.

DISCLOSURE OF THE INVENTION

The present invention further provides an ultra-thin oxide in a semiconductor device by eliminating the gate oxide deposition and relying on the former polysilicon reoxidation step to create the gate oxide.

The present invention provides a semiconductor device having a transistor or capacitor with an ultra-thin oxide which is thinner than 10 angstroms in thickness manufactured by eliminating a gate oxide step in the processing and using the polysilicon reoxidation step to create the ultra-thin gate oxide after formation of the gate.

An advantage of the present invention is to provide a simplification to the process of manufacturing semiconductors.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
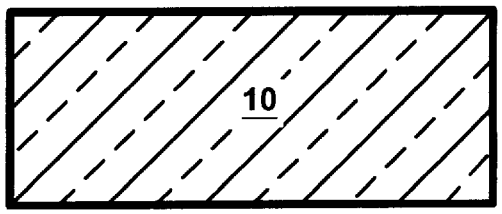
FIG. 1 (PRIOR ART) is a cross section of a semiconductor silicon substrate.

Referring now to FIG. 1 (PRIOR ART), therein is shown a prior art silicon substrate 10 which has been cleaned. It should be understood that, although the silicon has been cleaned, there will be residual oxides on the surface of the silicon substrate 10.

Figure 2:
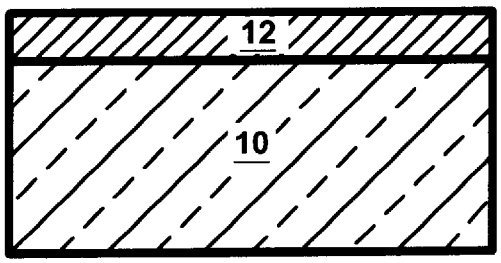
FIG. 2 (PRIOR ART) is a cross section of FIG. 1 after oxide growth.

Referring now to FIG. 2 (PRIOR ART), therein is shown the prior art silicon substrate 10 having grown thereon an oxide 12. The oxide 12 of silicon dioxide is generally grown as thinly as possible which in the prior art was thicker than 15 angstroms.

Figure 3:
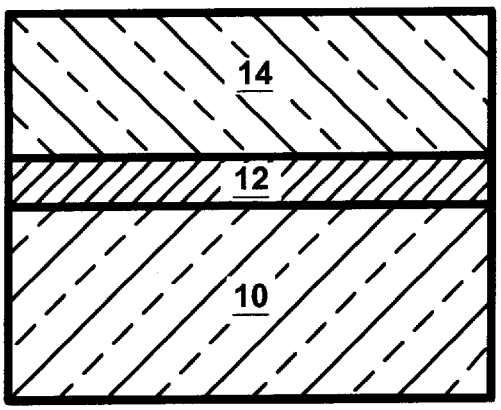
FIG. 3 (PRIOR ART) is a cross section of FIG. 2 after polysilicon deposition.

Referring now to FIG. 3 (PRIOR ART), therein is shown the prior art silicon substrate 10 and the oxide 12 having prior art polysilicon 14 deposited on the oxide 12.

Figure 4:
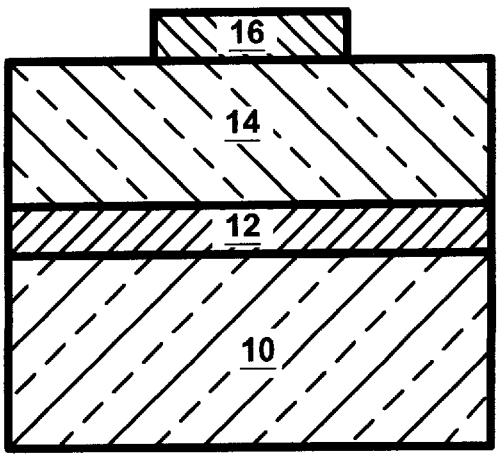
FIG. 4 (PRIOR ART) is a cross section of FIG. 3 after photoresist patterning.

Referring now to FIG. 4 (PRIOR ART), therein is shown the prior art gate mask formed of photoresist 16. The photoresist 16 has been patterned and etched in a conventional photolithographic process to form the gate mask which is the remaining photoresist 16.

Figure 5:
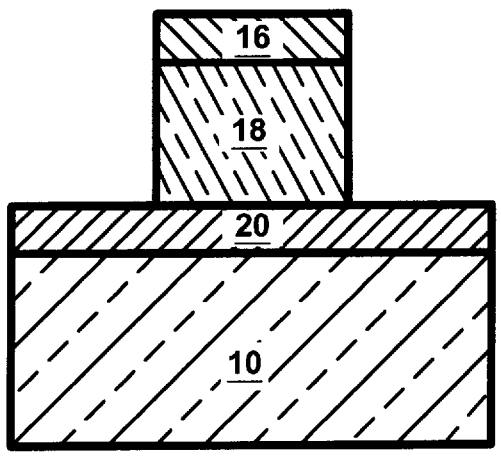
FIG. 5 (PRIOR ART) is a cross section of FIG. 4 after gate etch.

Referring now to FIG. 5 (PRIOR ART), therein is shown the prior art semiconductor after gate etching. The gate etching has converted the polysilicon 14 into the polysilicon gate 18, and the oxide 12 into gate oxide 20.

Figure 6:
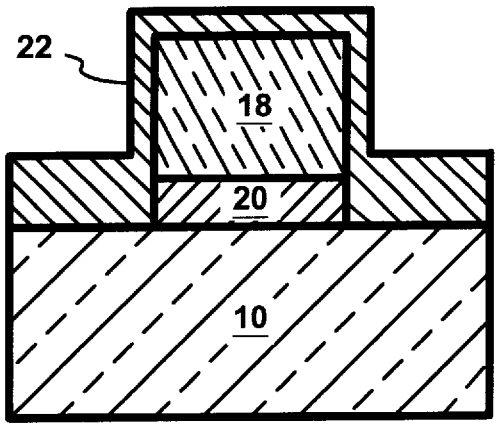
FIG. 6 (PRIOR ART) is a cross section of FIG. 5 after removal of photoresist and polysilicon reoxidation.

Referring now to FIG. 6 (PRIOR ART), therein is shown the prior art semiconductor after the photoresist 16 has been removed and after polysilicon reoxidation which lays down an oxide 22 on to the silicon substrate 10 in preparation for other steps in the manufacturing process.

Figure 7:
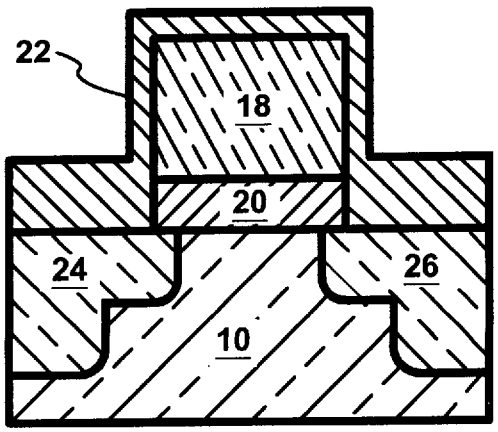
FIG. 7 (PRIOR ART) is a cross section of a transistor.

Referring now to FIG. 7 (PRIOR ART), therein is shown the finished prior art transistor having the polysilicon gate 18 and the gate oxide 20 of thicker than 15 angstroms thickness disposed over the silicon substrate 10 with two subsequently implanted source and drain regions 24 and 26. It should be understood that the above processing is also used to manufacture semiconductor capacitors with the oxide as the dielectric.

Referring now to FIG. 8 through FIG. 13, it should be noted that they have been placed side by side with certain of the prior art figures, FIG. 1 (PRIOR ART) and FIG. 3 (PRIOR ART) through FIG. 7 (PRIOR ART), to show that the same process step is being performed in both figures. The same numbers are used to refer to the same portions except that the portions of the present invention are designated by prime symbols.

Figure 8:
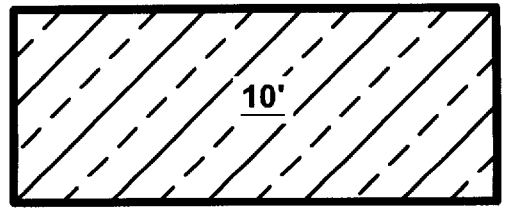
FIG. 8 is a cross section of a semiconductor silicon substrate.

Referring now to FIG. 8, therein is shown a silicon substrate 10' which has been cleaned through conventional preprocessing. Again, it should be understood that, although the silicon has been cleaned, there will be residual oxides on the surface of the silicon substrate 10'.

Figure 9:
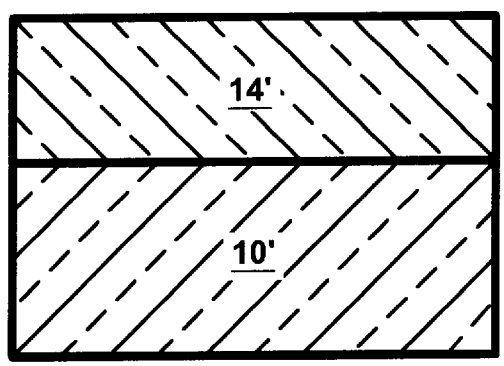
FIG. 9 is a cross section of FIG. 8 after polysilicon deposition.

Before referring to FIG. 9, it should be noted that there is no figure side by side with FIG. 2 because this step has been eliminated in the present invention.

Referring now to FIG. 9, therein is shown the silicon substrate 10' having polysilicon 14' deposited directly on the silicon substrate 10'.

Figure 10:
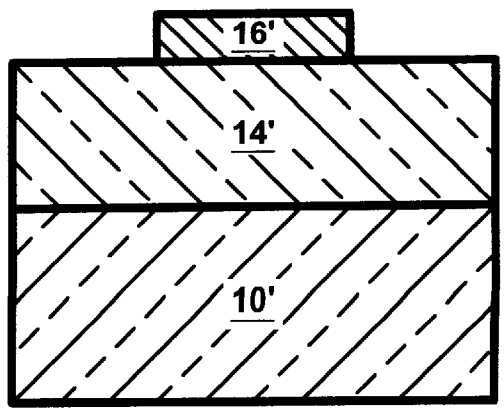
FIG. 10 is a cross section of FIG. 9 after photoresist patterning.

Referring now to FIG. 10, therein is shown the gate mask formed of photoresist 16'. The photoresist 16' has been patterned and etched in a conventional photolithographic process to form the gate mask which is the remaining photoresist 16'.

Figure 11:
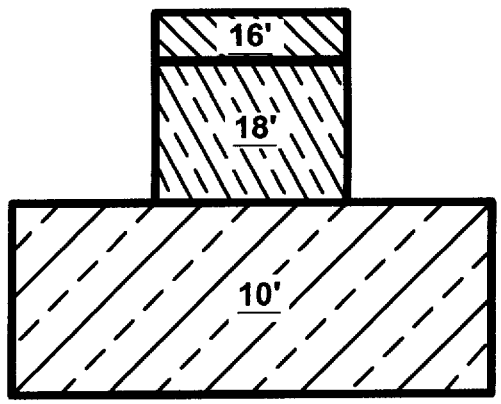
FIG. 11 is a cross section of FIG. 10 after gate etch.

Referring now to FIG. 11, therein is shown the semiconductor after gate etching. The gate etching has converted the polysilicon 14' into the polysilicon gate 18'.

Figure 12:
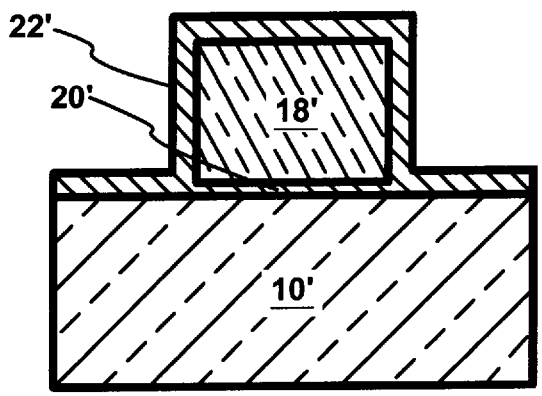
FIG. 12 is a cross section of FIG. 11 after removal of photoresist and polysilicon reoxidation.

Referring now to FIG. 12, therein is shown the semiconductor after the photoresist 16' has been removed and after polysilicon reoxidation which lays down an oxide 22' on to the silicon substrate 10' in preparation for other steps in the manufacturing process. It should be noted that the residual oxide on the surface of the silicon substrate assists the oxide 22' to diffuse under the polysilicon gate 18' in an ultra-thin film of less than 10 angstroms thickness.

Figure 13:
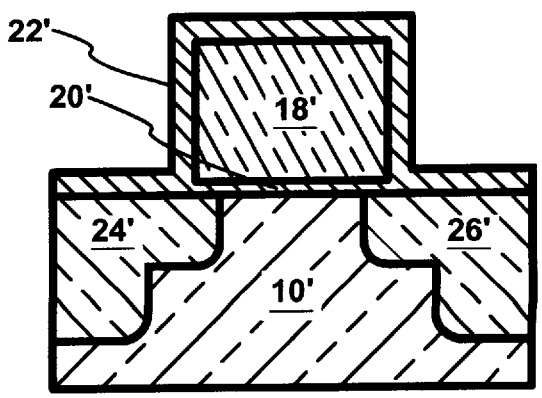
FIG. 13 is a cross section of a transistor according to the present invention.

Referring now to FIG. 13, therein is shown the finished transistor having the polysilicon gate 18' and the ultra-thin gate oxide 20' disposed over the silicon substrate 10' with two subsequently implanted source and drain regions 24' and 26'.

The prior art processing starts with various preprocessing steps to arrive at the silicon substrate 10 shown in FIG. 1 (PRIOR ART) which is cleaned of contaminants. Since silicon is so reactive with oxygen, it is known that there will be residual oxides on the surface of the silicon which will not be removed.

The silicon substrate 10 will be subject to a thermal oxidation process in a quartz furnace where a flow of dry oxygen or an oxygen-argon mixture converts the silicon to silicon dioxide. It is understood by those skilled in the art that there is a region of silicon and silicon dioxide rather than the line shown in the figures but that there are well known ways of measuring the thickness of the oxide 12. The furnace will be at a constant temperature below 800° C. and brought up to 800° C. for 60 seconds and cooled down in order to create the silicon dioxide oxide 12.

It is also understood by those skilled in the art that the oxide thickness is related to the amount of oxygen, the flow speed of the oxygen, and the pressure that the oxygen is under. With less oxygen, slower flow, or less oxygen pressure, the oxide layer will be thinner. The precise relationships are well known in the art.

It is generally recognized that higher oxidation temperatures mean that the silicon dioxide will be of greater density and thus have a higher dielectric strength. However, higher temperatures result in thicker depositions of oxide with all other conditions remaining the same.

Next, the prior art has the deposition of polysilicon 14 on top of the oxide 12. The polysilicon 14 is polycrystalline silicon which is silicon with only a short-range crystal structure. This generally done in a chemical vapor deposition (CVD) process which is controlled to provide the thickness desired for the transistor gate.

Once the polysilicon 14 is laid down, the photoresist 16 placed on top of the polysilicon 14. The photoresist 16 is patterned and exposed to light in a conventional photolithographic process and hardened. The soft photoresist 16 is then etched away to leave the hard photoresist 16 over the desired gate area.

The polysilicon 14 and the oxide 12 are then subject to a conventional anisotropic etch which forms the polysilicon gate 18 and the gate oxide 20 as shown in FIG. 5 (PRIOR ART) by etching down to the silicon substrate 10. The photoresist 16 is subsequently removed.

Next, a polysilicon reoxidation is performed in the quartz furnace where a flow of dry oxygen or an oxygen-argon mixture converts the silicon to silicon dioxide. The furnace will be at a constant temperature below 900° C. and brought up to 900° C. for between 30 to 100 minutes and cooled down in order to create a 100 angstrom thick silicon dioxide oxide 22. Since the oxide 22 thickness is not as critical as the gate oxide 20 thickness, the parameters are much less critical so the temperature can be as low as 800° C. and as high as 1000° C. and the time can be anything less than around 100 minutes.

This polysilicon reoxidation is performed as preprocessing to the formation of the subsequently implanted source and drain regions 24 and 26.

After further processing, the prior art transistor as shown in FIG. 7 (PRIOR ART) is formed.

The present invention processing starts with the same preprocessing steps as the prior art to arrive at the silicon substrate 10' shown in FIG. 8 which is cleaned of contaminants. There will be 1 to 2 angstroms of residual oxides on the surface of the silicon which will not be removed.

The silicon substrate 10' will be not be subject to a thermal oxidation process at this step. Instead, the polysilicon 14' is deposited directly on top of the residual oxides on the silicon substrate 10' by CVD. This leaves the residual oxide sandwiched between the polysilicon 14' and the silicon substrate 10'.

Once the polysilicon 14' is laid down, the photoresist 16' placed on top of the polysilicon 14'. The photoresist 16' is patterned and exposed to light in a conventional photolithographic process and hardened. The soft photoresist 16' is then etched away to leave the hard photoresist 16' over the desired gate area.

The polysilicon 14' is then subject to an anisotropic etch which forms the polysilicon gate 18' but without the gate oxide 20' in place. This is shown in FIG. 11. The photoresist 16' is subsequently removed.

The polysilicon reoxidation is performed at this step. The polysilicon reoxidation can be at higher temperatures and over longer periods of time which allows the residue of surface oxide to be the precursor for diffusion of oxygen and silicon dioxide between the polysilicon 14' and the silicon substrate 10'. This is shown in FIG. 11.

Simulations have shown that a polysilicon reoxidation at 900° C. and 40 minutes will grow a gate oxide 20' of approximately 2 angstroms thick. This would indicate that extremely close control of gate oxide 20' thickness is possible since the oxidation time could be in the range of 30 to 100 minutes.

After further processing, the transistor of the present invention as shown in FIG. 13 is formed. As would be evident to those skilled in the art, this approach could be used to provide the thinner dielectric required for other scaled semiconductor components. For example, the gate 18' would be one plate of a capacitor having an implanted substrate as the other and the gate oxide 20' as the dielectric.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the appended claims. All matters set forth herein or shown in the accompanying drawings are to be interpreted in an illustrative and non-limiting sense.

What is claimed is:

1. A structure for a semiconductor device comprising:

a silicon substrate having a residual oxide thereon;

a silicon deposition on said residual oxide on said silicon substrate; and an ultra-thin oxide diffused using said residual oxide between said silicon substrate and said silicon deposition, said ultra-thin oxide less than ten angstroms in thickness.

2. The structure as claimed in claim 1 wherein said silicon deposition forms a gate and said ultra-thin oxide forms a gate oxide.

3. The structure as claimed in claim 1 wherein said silicon deposition forms a gate, said ultra-thin oxide forms a gate oxide, and said silicon substrate has source and drain regions provided therein under said ultra-thin oxide.

4. A structure for a semiconductor device comprising:

a silicon substrate having residual oxide thereon;

a polycrystalline silicon deposition deposited directly on said residual oxide on said silicon substrate; and an ultra-thin oxide disposed between said silicon substrate and said polycrystalline silicon deposition by diffusion using said residual oxide during polysilicon reoxidation of said silicon substrate and said polycrystalline silicon deposition said ultra-thin oxide less than ten angstroms in thickness.

5. The structure as claimed in claim 4 wherein said polycrystalline silicon deposition is formed as a gate and said ultra-thin oxide is formed as a gate oxide.

6. The structure as claimed in claim 4 including said polycrystalline silicon deposition is formed as a gate, said ultra-thin oxide is formed as a gate oxide, and said silicon substrate has source and drain regions implanted therein under said ultra-thin oxide.

7. The structure as claimed in claim 4 wherein said polysilicon reoxidation is at around 900° C.

8. The structure as claimed in claim 4 wherein said polysilicon reoxidation is at around 900° C. for less than 100 minutes.

9. A method of manufacturing a structure for a semiconductor device consisting of:

preprocessing to clean a silicon substrate;

depositing a polycrystalline silicon directly on said residual oxide on said silicon substrate; and diffusing an ultra-thin oxide between said silicon substrate and said polycrystalline silicon deposition using said residual oxide during a polysilicon reoxidation of said silicon substrate and said polycrystalline silicon deposition and ultra-thin oxide less than ten angstroms in thickness.

10. The method as claimed in claim 9 including the steps of forming said polycrystalline silicon deposition into a semiconductor gate and forming said ultra-thin oxide into a semiconductor gate oxide.

11. The method as claimed in claim 9 including the steps of forming said polycrystalline silicon deposition into a semiconductor gate, forming said ultra-thin oxide into a gate oxide, and implanting said silicon substrate with semiconductor source and drains.

12. The method as claimed in claim 9 wherein said step of polysilicon reoxidation is performed under 1000° C.

13. The method as claimed in claim 9 wherein said step of polysilicon reoxidation is for less than 100 minutes.

14. The method as claimed in claim 9 wherein said step of polysilicon reoxidation is performed at around 900° C.

15. The method as claimed in claim 9 wherein said step of polysilicon reoxidation is at around 900° C. for less than 100 minutes.

16. A method of manufacturing a structure for a semiconductor device consisting of:

preprocessing to clean a silicon substrate and leaving a residual oxide thereon;

depositing polycrystalline silicon directly on said residual oxide on said silicon substrate;

forming a gate from said deposited polycrystalline silicon;

oxidizing said gate to form an ultra-thin oxide between said silicon substrate and said polycrystalline silicon deposition using said residual oxide during a polysilicon reoxidation of said silicon substrate and said gate, said ultra-thin oxide less than ten angstroms in thickness.

17. The method as claimed in claim 16 including preprocessing for implantation of semiconductor source and drain regions and implanting said silicon substrate with semiconductor source and drain regions.

18. The method as claimed in claim 16 wherein said step of oxidizing said gate is performed under 1000° C.

19. The method as claimed in claim 16 wherein said step of oxidizing said gate is for less than 100 minutes.

20. The method as claimed in claim 16 wherein said step of oxidizing said gate is at around 900° C. for less than 100 minutes.

* * * * *